(12) United States Patent
Yoshida

(10) Patent No.: US 8,138,096 B2
(45) Date of Patent: Mar. 20, 2012

(54) PLASMA ETCHING METHOD

(75) Inventor: Ryoichi Yoshida, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1059 days.

(21) Appl. No.: 12/025,341

(22) Filed: Feb. 4, 2008

(65) Prior Publication Data

US 2008/0194114 A1     Aug. 14, 2008

Related U.S. Application Data

(60) Provisional application No. 60/916,322, filed on May 7, 2007.

(30) Foreign Application Priority Data

Feb. 8, 2007   (JP) ................................. 2007-029580

(51) Int. Cl.
*H01L 21/3065* (2006.01)
(52) U.S. Cl. ........ 438/714; 438/737; 438/719; 438/706; 438/707; 438/710; 438/711; 438/717; 438/723; 438/724; 438/734; 438/736; 216/58; 216/61; 216/67; 216/70; 216/71; 216/72; 216/74; 216/79
(58) Field of Classification Search ................. 438/719, 438/706, 707, 710, 711, 717, 723, 724, 734, 438/736, 737; 216/41, 58, 61, 67, 70, 71, 216/72, 74, 79
See application file for complete search history.

(56) References Cited

U.S. PATENT DOCUMENTS

| | | | |
|---|---|---|---|
| 7,307,025 B1 * | 12/2007 | Worsham et al. | 438/711 |
| 2003/0211750 A1 * | 11/2003 | Kim et al. | 438/711 |
| 2005/0064698 A1 * | 3/2005 | Chang et al. | 438/623 |
| 2005/0101137 A1 * | 5/2005 | Kato et al. | 438/689 |
| 2006/0037701 A1 * | 2/2006 | Koshiishi et al. | 156/345.44 |
| 2006/0037703 A1 | 2/2006 | Koshiishi et al. | |
| 2006/0066247 A1 | 3/2006 | Koshiishi et al. | |
| 2009/0081873 A1 * | 3/2009 | Park et al. | 438/700 |

FOREIGN PATENT DOCUMENTS

| | | |
|---|---|---|
| JP | 2006-100510 | 4/2006 |
| JP | 2006-270019 | 10/2006 |
| WO | WO 2006/001356 A1 | 1/2006 |

OTHER PUBLICATIONS

Japanese Office Action issued May 17, 2011, in Patent Application No. 2007-029580 (with English-language translation). Office Action issued Sep. 27, 2011, in Japanese Patent Application No. 2007-029580 filed Feb. 8, 2007 (with English translation).

* cited by examiner

*Primary Examiner* — Lan Vinh
*Assistant Examiner* — David Kaufman
(74) *Attorney, Agent, or Firm* — Oblon, Spivak, McClelland, Maier & Neustadt, L.L.P.

(57) ABSTRACT

In a plasma etching method, a substrate including an underlying film, an insulating film and a resist mask is plasma etched to thereby form a number of holes in the insulating film including a dense region and a sparse region by using a parallel plate plasma etching apparatus for applying a plasma-generating high frequency electric power to a space between an upper and a lower electrode and a biasing high frequency electric power to the lower electrode. The plasma etching method includes mounting the substrate on a mounting table; supplying a first process gas containing carbon and fluorine to form the holes in the insulating film to a depth close to the underlying film; and supplying a second process gas including an inert gas and another gas contain carbon and fluorine to have the holes reach the underlying film while applying a negative DC voltage to the upper electrode.

7 Claims, 8 Drawing Sheets

BEFORE DC BIAS APPLICATION

DURING DC BIAS APPLICATION

TEST EXAMPLE 1-1   SCALE FACTOR: ×80k

TEST EXAMPLE 1-2

COMPARATIVE EXAMPLE 1

PLASMA ETCHING METHOD

FIELD OF THE INVENTION

The present invention relates to a technology of forming a dense region having a high density of holes and a sparse region having a low density of holes on a substrate by plasma processing.

BACKGROUND OF THE INVENTION

As a low-k film of a semiconductor device, an SiOCH film whose k value (relative permittivity) is about 2.5 to 2.7 has been known.

In a dual damascene method for forming a copper wiring on a low-k film, for example, the following processes are sequentially performed as shown in FIGS. 9A to 9C: forming a underlayer wiring 101 on a substrate 100; depositing a material including Si and C such as an SiCN film 103 as a barrier film such that copper is diffused from the underlayer wiring 101 into an interlayer dielectric 104 which is a low-k film; and depositing the interlayer dielectric 104 thereon. The SiCN film 103 functions as an etch stop film when forming a via-hole 106 in the interlayer dielectric 104.

When forming the via-hole 106 in the interlayer dielectric 104, the composition ratio of the SiCN film 103 is very similar to that of the interlayer dielectric 104. In view of this, the following sequence is used. First, a main etching is performed to roughly etch the interlayer dielectric 104. Then, an over-etching is performed on the interlayer dielectric by converting a process gas into a gas that produces more reaction products. Thus, byproducts are deposited on the bottom of the via-hole 106. By adjusting an amount of the deposits 107 and an amount of active species, an etch rate is decreased to uniformize the depth of the via-hole 106 on the surface. Herein, a part of the byproducts generated by the over-etching is deposited on the bottom of the via-hole 106 as the deposits 107, and the remaining part of the byproducts is vaporized to be discharged together with the process gas.

However, depending on the structure of the device, the surface of the substrate 100 may have dense regions where the gap between the peripheries of the adjacent via-holes 106 is as narrow as, e.g., 0.1 μm, and sparse regions where the above-mentioned gap is as wide as, e.g., 2 μm. If the gap between the adjacent via-holes 106 varies over the surface as above, the total amount of the byproducts does not vary between the respective via-holes 106, but the amount of the byproducts that are vaporized in the via-holes 106 and then remaining on the surface of the wafer W may vary over the surface such that it is greater in the dense regions and smaller in the sparse regions.

The vaporized byproducts are activated by plasma energy, thereby forming the active species that contributes to the etching, and etching the deposits 107 on the bottom of the via-holes 106. Therefore, if the amount of the vaporized byproducts varies over the surface, the amount of the active species is non-uniformly distributed to cause an imbalance in the depths of the via-holes 106. Considering this, if the distribution of the via-holes is not uniform over the surface, the processing conditions including, e.g., a processing temperature, a processing pressure and plasma energy need to be adjusted such that the etching is performed with a uniform depth.

However, depending on the device, there may also exist an extremely sparse region where the gap between the adjacent via-holes 106 is 10 μm or more. In this region, since the amount of active species is very small, the etching process may be stopped in the middle of the process as shown in FIG. 9B. Since the over-etching is performed at a slow rate, an excessively small amount of the active species extremely slows down the etch rate. In this case, the etching process appears to be stopped altogether compared to the other regions where the via-holes 106 are distributed more densely.

Further, if the processing conditions including, e.g., a flow rate of inert gas and/or oxygen gas are adjusted such that the etching is completed in the extremely sparse region where the gap between the adjacent via-holes 106 is very large, the via-hole 106 may be excessively etched to penetrate the SiCN film 103 and reach the underlayer wiring 101 in a region where the via-holes 106 are densely distributed (see FIG. 9C). That is, in forming patterns including the dense region and the extremely sparse region by etching the interlayer dielectric 104, it is very difficult to enhance an etching performance with respect to the via-holes 106 while maintaining a selection ratio suitable for the SiCN film 103.

As a result, in the substrate 100 in which the distribution of the via-holes 106 is very biased, the processing conditions should be strictly controlled such that the depths of the bottom surfaces of all the via-holes 106 are fitted between the top and the bottom surfaces of the SiCN film 103 (i.e., within the depth range where the SiCN film 103 is located). Therefore, the degree of freedom of the processing conditions is significantly limited. In addition, for achieving a more high-layered lamination of the device, it is required to thin the film thickness of the SiCN film 103. In this case, the processing conditions should be more strictly controlled.

The Patent Document 1 discloses a technology in which a negative DC voltage is applied to an upper electrode to increase a selection ratio in etching on an SiOC interface film formed on an SiC film. However, there is no discussion about the substrate 100 in which the via-holes 106 are non-uniformly distributed.

(Patent Document 1) Japanese Patent Application Publication No. 2006-270017 (Paragraphs 0073, 0084, 0173).

SUMMARY OF THE INVENTION

In view of the foregoing, the present invention provides a technology capable of plasma-etching an insulating film including silicon and carbon to form via-holes in a manner that the via-holes have a uniform depth without decreasing a selection ratio of an underlying film containing silicon and carbon, even when the via-holes are non-uniformly distributed over a substrate.

In accordance with an aspect of the present invention, there is provided a plasma etching method of plasma etching a substrate including an underlying film containing silicon and carbon, an insulating film to be etched containing silicon and carbon, and a resist mask having a pattern, wherein the underlying film, the insulating film and the resist mask are sequentially deposited from below, to thereby form a number of holes in the insulating film including a dense region where a density of the holes is high and a sparse region where the density of the holes is low, by using a parallel plate plasma etching apparatus for applying a plasma-generating high frequency electric power to a space between an upper electrode and a lower electrode to render a process gas into a plasma state and a biasing high frequency electric power to the lower electrode.

The plasma etching method includes mounting the substrate on a mounting table serving as the lower electrode in a processing chamber; supplying a first process gas containing carbon and fluorine into the processing chamber to form the holes in the insulating film to a depth close to the underlying film by plasma etching the substrate; and supplying a second process gas including an inert gas and another gas contain carbon and fluorine into the processing chamber to have the holes reach the underlying film by plasma etching the substrate while applying a negative DC voltage to the upper electrode.

It is preferable that the holes are via-holes for burying an electrode part or a connection part that connects a lower wiring to an upper wiring. Further, it is preferable that, in the dense region, a distance between peripheries of adjacent ones of the holes is 0.1 μm or less. Further, it is preferable that, in the sparse region, a distance between peripheries of adjacent one of the holes is 10 μm or more. Further, it is preferable that the underlying film is made of silicon, carbon and nitrogen, and the insulating film is made of silicon, oxygen, carbon and hydrogen.

It is possible that the first process gas includes a $CF_4$ gas and an inert gas, and further includes at least one selected from a $C_4F_8$ gas, a $C_4F_6$ gas and a $C_5F_8$ gas, wherein the second process gas includes an Ar gas and a nitrogen gas or an $O_2$ gas, and further includes at least one selected from a $C_4F_8$ gas, a $C_4F_6$ gas, and a $C_5F_8$ gas, and wherein the insulating film is a porous film whose relative permittivity is 2.5 or less.

In the above, it is preferable that the first process gas further includes an $O_2$ gas.

It is possible that the first process gas includes a $CF_4$ gas, an inert gas and an $O_2$ gas, and further includes at least one selected from a $CH_2F_2$ gas and a $CHF_3$ gas, wherein the second process gas includes an Ar gas and a nitrogen gas or an $O_2$ gas, and further includes at least one selected from a $C_4F_8$ gas, a $C_4F_6$ gas, and a $C_5F_8$ gas, and wherein the insulating film is a high density film whose relative permittivity is within a range from 2.7 to 3.0.

In the above, it is preferable that the first process gas further includes at least one selected from a $C_4F_8$ gas, a $C_4F_6$ gas and $Ca_5F_8$ gas.

In accordance with the present invention, in performing a plasma etching on an insulating film including silicon and carbon deposited on an underlying film including silicon and carbon to form a dense region where via-holes are densely distributed and a sparse region where via-holes are sparsely distributed. Further, a negative DC voltage is applied to an upper electrode in a parallel plate plasma etching apparatus during an over-etching process. In this manner, as will be apparent from the following test examples, it is possible to form via-holes whose depths are uniform between the dense region and the sparse region.

BRIEF DESCRIPTION OF THE DRAWINGS

The above objects the present invention will become apparent from the following description of the embodiments, given in conjunction with the accompanying drawings, in which.

DETAILED DESCRIPTION OF THE EMBODIMENTS

Figure 1:
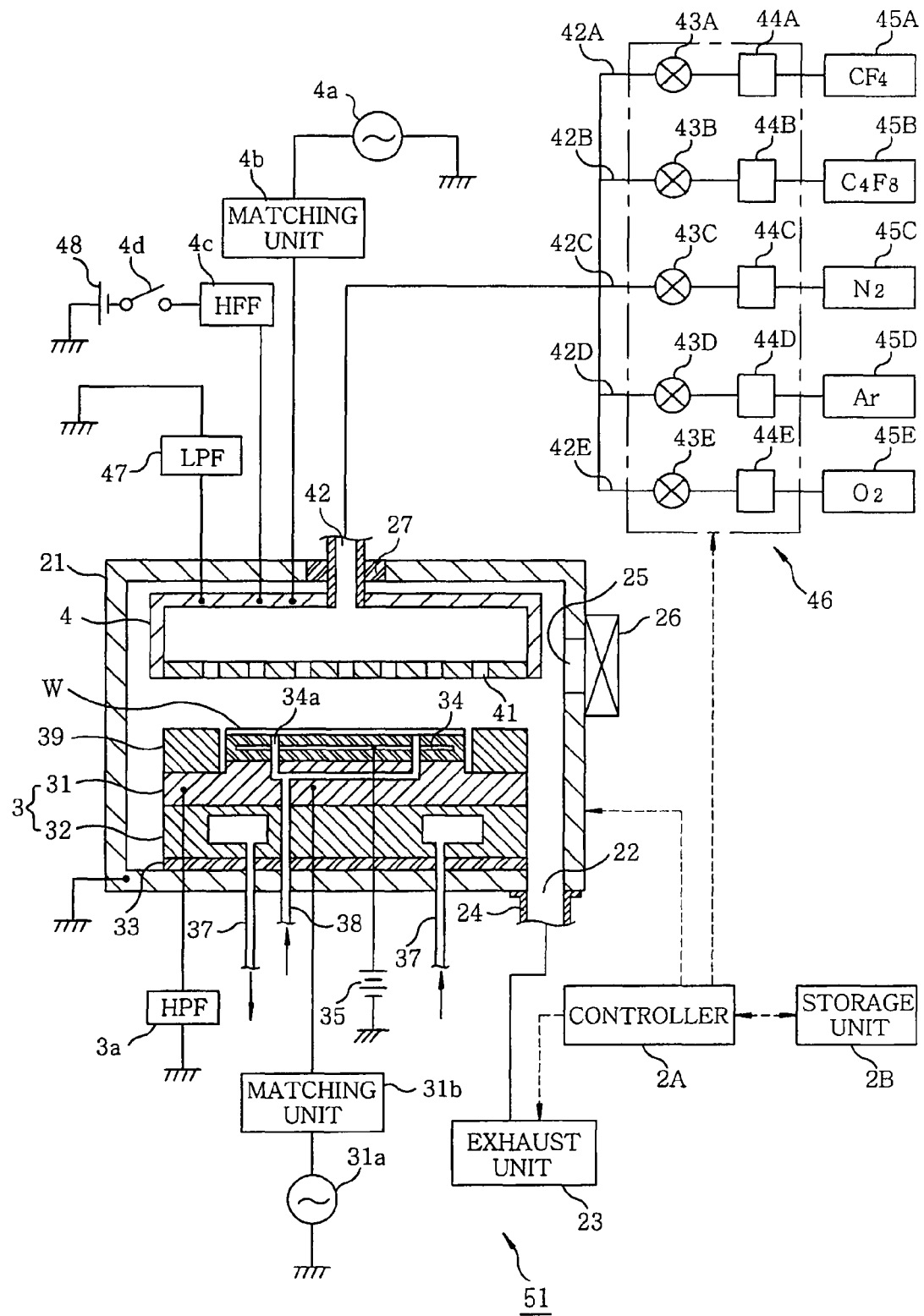
FIG. 1 is a schematic cross-sectional view of a plasma processing apparatus used in plasma processing in accordance with an embodiment of the present invention.

Hereinafter, an embodiment of a plasma processing apparatus for performing a plasma processing method in accordance with the present invention will be described in detail with reference to FIG. 1. The plasma processing apparatus 51 includes a processing chamber 21 formed of a vacuum chamber, a mounting table 3 disposed on a lower center in the processing chamber 21, and an upper electrode 4 disposed on an upper surface of the processing chamber 21.

The processing chamber 21 is electrically grounded, and an exhaust unit 23 including a vacuum pump is connected to an exhaust port 22 at the bottom of the processing chamber 21 via an exhaust pipe 24. A transfer port 25 for transferring a wafer W is disposed at a wall surface of the processing chamber 21, and the transfer port 25 can be opened and closed by a gate valve 26.

The mounting table 3 includes a lower electrode 31 and a support member 32 for supporting a lower part of the lower electrode 31, and is disposed over the bottom of the processing chamber 21 by way of an insulation member 33. An electrostatic chuck 34 is disposed on the mounting table 3, and a voltage is applied from a high voltage DC power supply 35 to electrostatically adsorb the wafer W onto the mounting table 3.

A temperature control passage 37 through which a temperature control medium flows is formed in the mounting table 3 to adjust a temperature of the wafer W to a desired level using the temperature control medium.

In addition, a gas flow passage 38 is formed in the mounting table 3 to supply a heat conductive gas, e.g., He gas, as a backside gas. The gas flow passage 38 is opened to plural locations of an upper surface of the mounting table 3. These openings are in communication with through-holes 34a formed in the electrostatic chuck 34.

The lower electrode 31 is grounded via a high pass filter (HPF) 3a, and a high frequency power supply 31a having a frequency of, e.g., 13.56 MHz is connected thereto via a matching unit 31b.

In addition, a focus ring 39 is disposed at an outer periphery of the lower electrode 31 to surround the electrostatic chuck 34 such that, when plasma is generated, the plasma is converged to the wafer W on the mounting table 3 through the focus ring 39.

The upper electrode 4 has a hollow structure. A plurality of holes 41 are uniformly formed at a lower surface of the upper electrode 4 at a specific interval to supply the process gas into the processing chamber 21, forming a gas shower head. In addition, a gas inlet pipe 42 serving as a gas supply path is disposed at an upper center of the upper electrode 4 to penetrate the upper center of the processing chamber 21 via the insulation member 27. Further, the gas inlet pipe 42 is branched off in an upstream side into five branch pipes 42A to 42E, which are connected to gas supply sources 45A to 45E via valves 43A to 43E and mass flow controllers 44A to 44E. The valves 43A to 43E and the mass flow controllers 44A to 44E constitute a gas supply system 46.

The upper electrode 4 is grounded via a low pass filter (LPF) 47. A high frequency power supply 4a, which serves as a plasma generating means by generating a high frequency (e.g., 60 MHz) higher than that of the high frequency power supply 31a, is connected to the upper electrode 4 via a matching unit 4b. In addition, a DC power supply 48 is connected to the upper electrode 4 via a high frequency filter 4c and a switch 4d such that a negative DC voltage of, e.g., 900 V is applied to the upper electrode 4.

A high frequency power generated by the high frequency power supply 4a connected to the upper electrode 4 renders the process gas into a plasma state. A high frequency power generated by the high frequency power supply 31a connected to the lower electrode 31 applies a bias power to the wafer W to attract ions in the plasma onto the surface of the wafer W. In addition, a negative DC voltage generated by the DC power supply 48 increases the density of the plasma at the vicinity of the wafer W to reduce a bias in the distribution of the active species over the surface of the wafer W.

The plasma processing apparatus 51 includes a controller 2A including a computer for example. The controller 2A is provided with a program, a memory, a data processing part including a CPU or the like. The program has commands for sending control signals from the controller 2A to the respective parts of the plasma processing apparatus 51 to execute the respective steps (which will be described later) for processing and transferring the wafer W. In addition, the memory has a region to which processing parameters such as a processing pressure, a processing temperature, a processing time, a gas flow rate, an electric power and the like are inputted. When the CPU executes the respective commands of the program, these processing parameters are read out, and the control signals corresponding to the parameters are transmitted to the respective parts of the plasma processing apparatus 51. The program (which also includes a program related to input operation or display of the processing parameters) is stored in a computer storage medium such as a storage unit 2B which is configured by, for example, a flexible disc, a compact disc, a magneto-optical (MO) disc, a hard disc, and is installed in the controller 2A.

Next, an embodiment of a plasma processing method using the plasma processing apparatus 51 in accordance with the present invention will be described in detail. First, the water W is mounted on the mounting table 3 in the processing chamber 21 by a substrate transfer unit (not shown), and then, the gate valve 26 is closed. In succession, a backside gas is supplied from the gas flow passage 38 to adjust the temperature of the wafer W to a desired temperature. Then, the subsequent steps are carried out.

Figure 2:
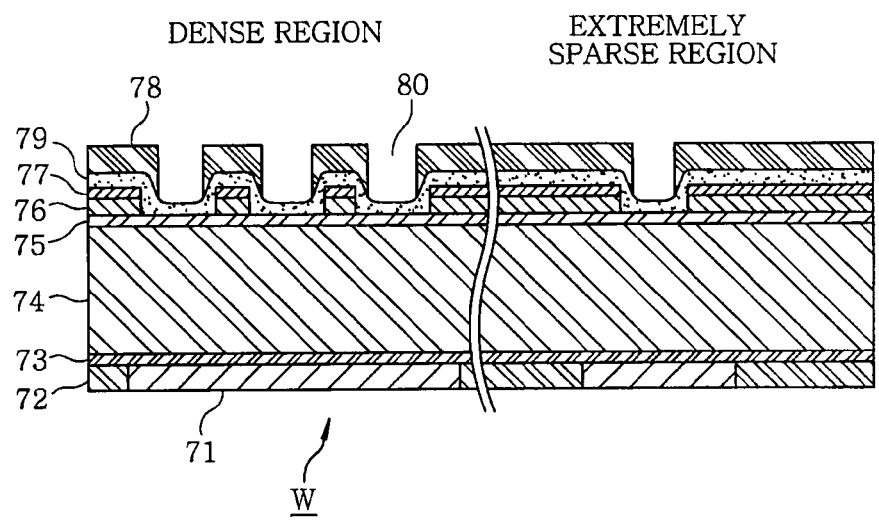
FIG. 2 is a cross-sectional view showing an example of a substrate used in the plasma processing.

FIG. 2 shows a surface structure of the wafer W. The wafer W includes an SiCOH film 72 as an nth film (where n is an integer of 1 or more) in which a metal wiring 71 is buried; an SiCN film 73 which is an underlying film formed as an etch stop film; an SiCOH film 74 which is an insulating film (a low-k film of a via-layer) formed as an (n+1)th film to be processed in the process of the present invention; and a silicon oxide film 75 which is an insulating film (a cap film of the via-layer). These films are sequentially deposited from below. The wafer W shows a state during an exemplary process of forming an (n+1)th wiring layer in the SiCOH film 74.

Further, in order to form openings 80 including grooves and via-holes 81 in the SiCOH film 74 by a dual damascene method, a TiN film 76, an SiON film 77 and a resist mask 78 are sequentially deposited on the silicon oxide film 75. The TiN film 76 and the SiON film 77 function as a hard mask to form a trench after forming the via-holes 81. Further, an anti-reflective coating 79 is formed under the resist mask 78.

The film thicknesses of the SiCN film 73, the SiCOH film 74, the silicon oxide film 75, the TiN film 76, the SiON film 77, the anti-reflective coating 79, and the resist mask 78 are, for example, 600 Å, 3400 Å, 500 Å, 300 Å, 300 Å, 1000 Å, and 2600 Å, respectively.

Further, the wafer W includes a dense region where the gap L between the peripheries of the openings 80 formed in the resist mask 78 is small, e.g., 0.1 µm; a sparse region where the gap L is large, e.g., 2 µm; and an extremely sparse region where the gap L is very large, e.g., 10 µm.

Figure 3:
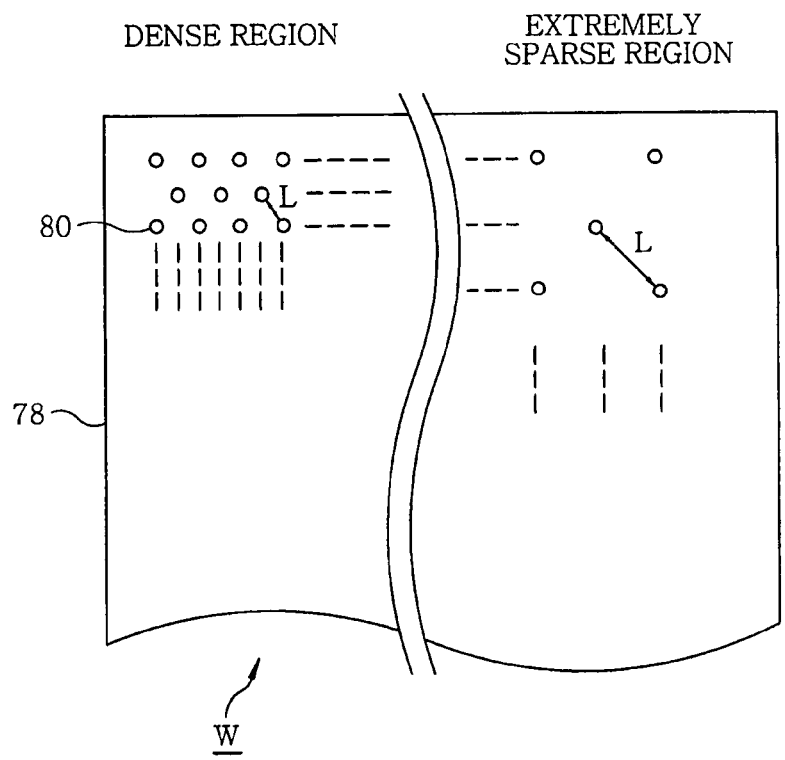
FIG. 3 is a plan view showing the distribution of via-holes over the substrate.

As shown in FIG. 3, "the gap L between the peripheries of the openings 80" means the shortest gap between the adjacent openings 80. Herein, FIG. 3 shows an exemplary enlarged view of a portion of the wafer W that forms a single device. Further, during the etching process, the dense region shows reactions similar to those of the sparse region. Therefore, the dense region and the extremely sparse region will be shown and described while omitting the sparse region. The resist mask 78 has a groove-shaped opening portions (referred to as "shield rings") formed to surround the plural openings 80 included in the respective devices. When etching the via-holes 81, the opening portion is etched as well, but this is omitted from the drawing.

Step 1: Etching Process of Silicon Oxide Film 75

The processing chamber 21 is vacuum exhausted by the exhaust unit 23 via the exhaust pipe 24 to maintain the processing chamber 21 at a specific vacuum level of, e.g., 20 Pa (150 mTorr). Then, for example, $CF_4$ gas as a process gas is supplied from the gas supply system 46 at a flow rate of 200 sccm. Subsequently, a high frequency power having a frequency of, e.g., 60 MHz and a power of, e.g., 1000 W, is supplied to the upper electrode 4 to render the process gas into a plasma state. At the same time, a biasing high frequency power having a frequency of, e.g., 13.56 MHz and a power of, e.g., 600 W is supplied to the lower electrode 31.

Figure 4A:
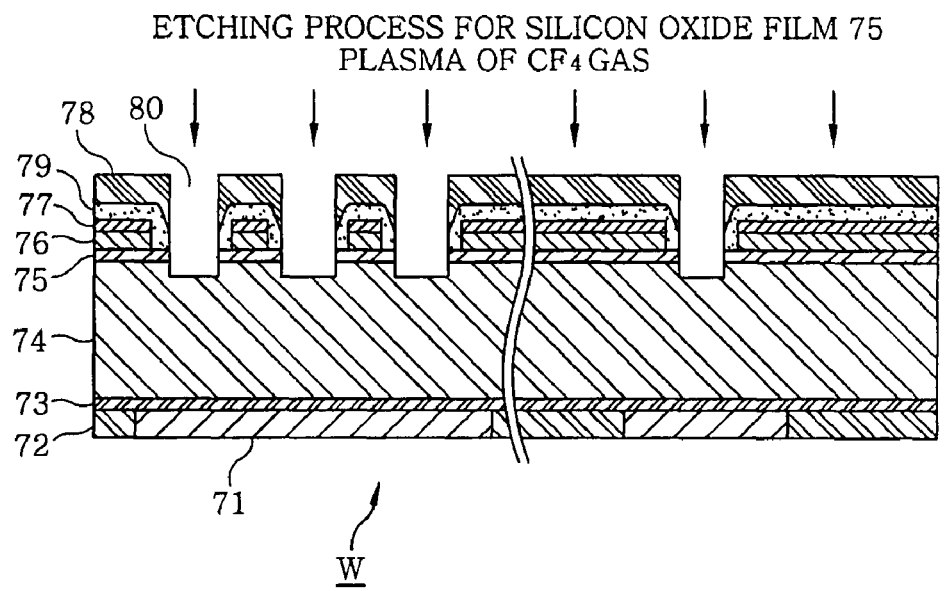
FIGS. 4A and 4B are cross-sectionals view for explaining an example of process performed in the plasma processing.

The plasma contains compounds of carbon and fluorine as active species. When the silicon oxide film 75 is exposed to the active species atmosphere, it reacts with atoms in the film to generate chemical compounds, thereby etching the anti-reflective coating 79 and the silicon oxide film 75 as shown in FIG. 4A. By this etching, the SiCOH film 74 is slightly etched to, for example, 50 nm. In addition, the resist mask 78 is also slightly etched, so that the film thickness thereof is decreased to, for example, 120 nm.

Step 2: Etching Process of the SiCOH Film 74: Main Etching

After etching the silicon oxide film 75, an electric power generated by the high frequency power supplies 4a and 31a is cut off to stop the generation of the plasma in the processing chamber, and then, the gas supply from the gas supply system 46 is stopped as well. Next, the remaining gas is removed by vacuum exhausting the processing chamber 21 using the exhaust unit 23, and the processing chamber 21 is maintained at a specific vacuum level of, for example, 9.3 Pa (70 mTorr). Then, a main etching is performed as a first etching process, which will be set forth below.

$CF_4$ gas, $CH_2F_2$ gas, $N_2$ gas and $O_2$ gas are, for example, supplied as a first process gas into the processing chamber 21 from the gas supply system 46 with a flow rate of, for example, 50, 25, 350 and 10 sccm, respectively. In addition, a high frequency power having a frequency of 60 Hz and as power of 600 W is supplied to the upper electrode 43 to render the process gases into a plasma state, and at the same time, a biasing high frequency power having a frequency of 13.56 MHz and a power of 1000 W is supplied to the lower electrode 31.

Figure 4B:
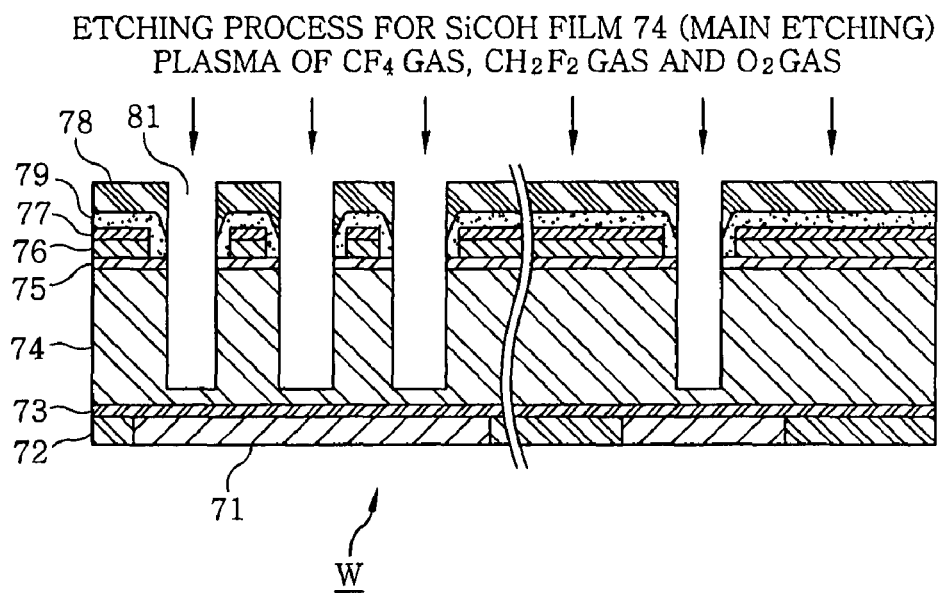

As shown in FIG. 4B, most of the SiCOH film 74 is etched by this plasma such that the distance between the bottom of the via-holes 81 and the top of the SiCN film 73 is, for example, about 30 nm over the entire surface.

In addition, although the $CF_4$ gas, the $CH_2F_2$ gas, $N_2$ gas and $O_2$ gas are used as the process gas in the above example, $CHF_3$ gas may be used instead of $CH_2F_2$ gas. Further, a gas including the elements of carbon and fluorine (e.g., $C_4F_8$ gas, $C_4F_6$ gas, and $C_5F_8$ gas) may also be added into the above-mentioned gases. Further, Ar gas may be used instead of $N_2$ gas.

In the above, the via-holes 81 are formed in the SiCOH film (high density film) 74 having a relatively high density and a k value (relative permittivity) of 2.7 or more. However, in case of forming the via-holes 81 in a porous film having a k value of 2.5 or less, the process gas should exclude $CH_2F_2$ gas and $CHF_3$ gas from the above combination of gases. The reason is as follows: whereas the selection ratio and the etching performance with respect to the via-holes 81 can be enhanced by using a process gas containing the element of hydrogen in case of the SiCOH film 74 having a high density, a surface of a porous film may be adversely modified by such process gas containing the element of hydrogen (for example, the permittivity may be increased). Further, when etching a porous film having a k value of 2.5 or less, $O_2$ gas may also be avoided for the same reason.

Step 3: Etching Process of the SiCOH Film 74: Over-Etching

After completing the main etching, Electric powers generated by the high frequency power supplies 4a and 31a are cut off to stop the generation of the plasma in the processing chamber 21, and then the supply of a gas from the gas supply system 46 is stopped as well. Next, the remaining gas remaining is removed by vacuum exhausting using the exhaust unit 23, and the processing chamber 21 is maintained at a specific vacuum level of, for example, 5.3 Pa (40 mTorr). Then, an over-etching is performed as a second etching process, which will be set forth below.

In order to increase the amount of deposits on the bottom surfaces of the via-holes 81 to slow down the etch rate, $C_4F_8$ gas, Ar gas and $N_2$ gas, for example, are supplied as second process gases into the processing chamber 21 from the gas supply system 46 with a flow rate of, for example, 10, 1000, and 180 sccm, respectively. In addition, a high frequency power having a frequency of 60 MHz and a power of 400 W is supplied to the upper electrode 4 to render the process gas into a plasma state, and at the same time, a biasing high frequency power having a frequency of 1356 MHz and a power of 1700 W is supplied to the lower electrode 31. Further, the switch 4d is closed to supply a negative DC voltage of, for example, 900 V, from the DC power supply 48 to the upper electrode 4.

Figure 5A:
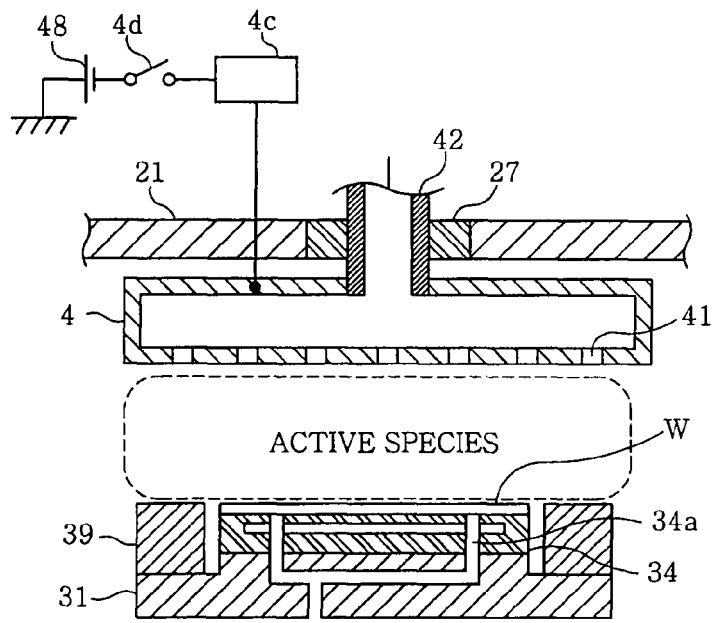
FIGS. 5A and 5B are schematic views showing the distribution of active species in a processing chamber before and after a DC bias is applied during the plasma processing.

As a result of this high frequency etching, a part of byproducts including silicon and carbon is deposited on the surface (especially the lower surface or side surface of each via-hole 81) on the wafer W such that the remaining part of the byproducts is activated by high frequency energy to become active species as shown in FIG. 5A. As described above, the amount of the active species over the dense region is different from that over the extremely sparse region (the amount of the active species is larger over the dense region).

Figure 5B:
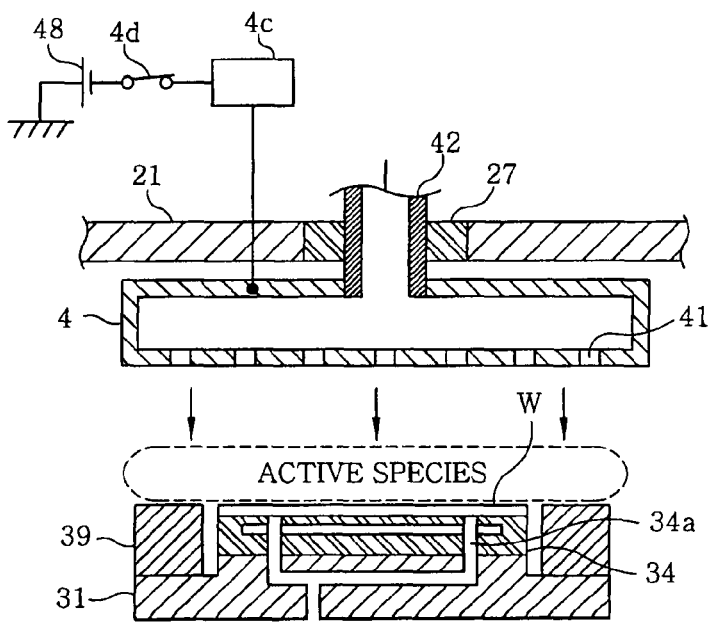
Figure 6:
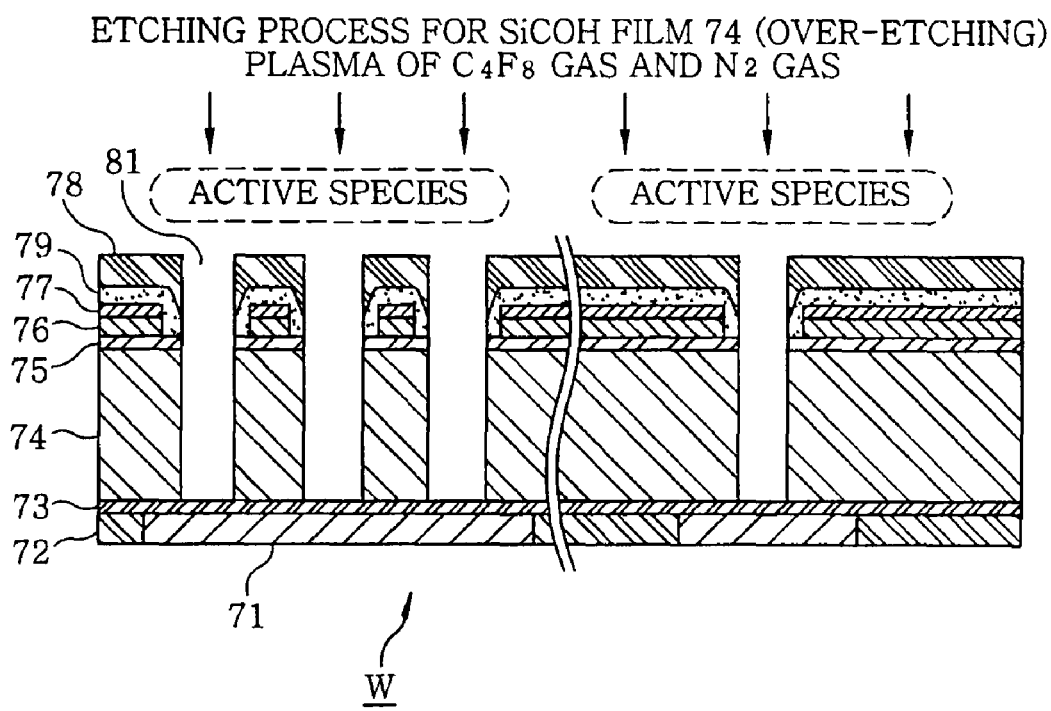
FIG. 6 is a schematic view showing a vicinity of a wafer W when the DC bias is applied.

However, by applying a negative DC bias to the upper electrode 4 while strongly attracting the ions in the plasma onto the wafer W by the biasing high frequency power, the ions are strongly pushed towards the wafer W to be compressed as shown in FIG. 5B. As a result, the plasma density is increased at the vicinity of the wafer W, which reduces the difference in the amount of the active species between over the dense region and over the extremely sparse region. Therefore, as shown in FIG. 6, since the etching is performed with a uniform depth over the entire surface, the etching can be prevented from being stopped at the extremely sparse region, and the via-holes 81 can be formed in the dense region without penetrating the SiCN film 73.

Further, in this process, $N_2$ gas is used to removing the deposits from the surface for reducing a bias in the distribution of the deposits over the surface. However, $O_2$ gas or Ar gas may also be used instead of $N_2$ gas. Besides, Ar gas may be used together with $N_2$ gas or $O_2$ gas. While $C_4F_8$ gas is used as the second process gas, other CF-based gases containing the elements of carbon and fluorine (e.g., $C_4F_6$ gas and $C_5F_8$ gas) that generate a large amount of deposits may also be used.

After this process, the resist mask 78 and the anti-reflective coating 79 are ashed to form a trench groove by using the SiON film 77 and the TiN film 76 as a hard mask.

In accordance with the above embodiment, the negative DC voltage is applied to the upper electrode 4 during the over-etching. Therefore, even if the amount of the active species generated from the deposits in the surface varies between the dense region and the sparse region, the amount of the active species in the vicinity of the wafer W is increased to such a degree where the bias in the distribution of the active species can be neglected. Accordingly, even at such regions where the distance L between the adjacent via-holes 81 is, for example, 10 μm or more, the etching process is not stopped in an unfinished state. In addition, even at such regions where the distance L between the adjacent via-holes 81 is as dense as, e.g., 0.1 μm, the via-holes 81 can be formed with a uniform depth over the entire surface such that the via-holes 81 do not penetrate the SiCN film 73.

Further, if a negative DC voltage is applied to the upper electrode 4 during the main etching, the etch rate is reduced, and the uniformity of the etch rate is degraded over the surface. However, since the negative DC voltage is applied during the over-etching in the present embodiment, it is possible to rapidly form the via-holes 81 with a uniform depth without causing the above problems. The ratio of the time for the main etching and the time for the over-etching can be adjusted as desired according to processing conditions and the type of device. Further, considering that the application of the DC voltage during the main etching has adverse effects but does not has an advantage, a method of applying a DC voltage at the end of the main etching is deemed equivalent to the present invention, and should be included in the scope of the present invention.

In the above descriptions, the SiON film 77 serves as the etch stop film, and the SiCOH film 74 is the film to be etched. However, the etching method in accordance with the present invention is not limited thereto, and may also be applied to a case where both of the etch stop film and the to-be-etched film include silicon and carbon.

In addition, while a negative voltage is applied to the upper electrode 4 in the above descriptions, it is also possible that a positive voltage is applied to the lower electrode 31 to attract plasma (ions). Further, a high frequency for plasma generation may be supplied to the lower electrode 31 by using an apparatus where two different frequencies are applied to a lower plate.

EXAMPLES

Test Example 1

Next, some tests performed with respect to the substrate processing method in accordance with the present invention will be described. In these tests, using the wafer W shown in FIG. 2, the etching of the step 1 and the step 2 were performed under the processing conditions (shown below), and then, over-etching was performed under the conditions (given for each example) to form the via-holes 81. Next, the dense region where the gap L between the via-holes 81 is small (about 0.1 µm) and the sparse region where the gap L is large (about 2 µm) were divided in the wafer W with different weights. Then, an SEM (Scanning Electron Microscope) observation of the cross-section was performed. In addition, since the extremely sparse region (where the gap L between the via-holes 81 is 10 µm or more) could not be evaluated by the same method, a resin was filled in the via-holes 81, and the cross-section of the via-holes 81 was observed by the SEM after the resin was cured.

Processing Conditions

Step 1: Etching of the Silicon Oxide Film 75

Processing pressure: 20 Pa (150 mTorr)
Process gas: $CF_4$=200 sccm
High frequency to the upper electrode 4: 60 MHz
Electric power to the upper electrode 4: 1000 W
Negative DC voltage to the upper electrode 4: 0V
High frequency to the lower electrode 31: 13.56 MHz
Electric power to the lower electrode 31: 600 W
Processing time: 60 seconds Step 2: Main Etching Processing pressure: 9.3 Pa (70 mTorr)
Process gas: $CF_4/CH_2F_2/N_2/O_2$=50/25/350/10 sccm
High frequency to the upper electrode 4: 60 MHz
Electric power to the upper electrode 4: 600 W
Negative DC voltage to the upper electrode 4: 0 V
High frequency to the lower electrode 31: 13.56 MHz
Electric power to the lower electrode 31: 1000 W
Processing time: 13 seconds Step 3: Over-etching Test Example 1-1

Processing pressure: 5.3 Pa (40 mTorr)
Process gas: $C_4F_8/Ar/N_2$=10/1000/180 sccm
High frequency to the upper electrode 4: 60 MHz
Electric power to the upper electrode 4: 400 W
Negative DC voltage to the upper electrode 4: 900 V
High frequency to the lower electrode 31: 13.56 MHz
Electric power to the lower electrode 31: 1700 W
Processing time: 42 seconds Test Example 1-2

Process gas: $C_4F_8/CF_4/Ar/N_2$=10/30/1000/180 sccm
Processing time: 34 seconds
Other conditions are the same as in test example 1-1

Comparative Example 1

Negative DC voltage to the upper electrode 4: 0 V
Other conditions are the same as in test example 1-1

Test Results

Figure 7A:
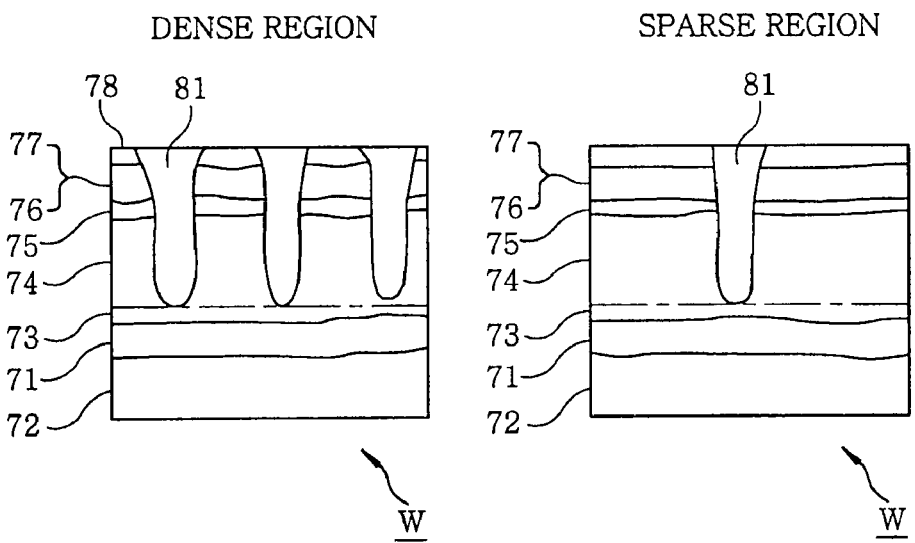
FIGS. 7A and 7B are schematic views of SEM photographs showing a cross section of a substrate obtained by a test example of the present invention.
Figure 7B:
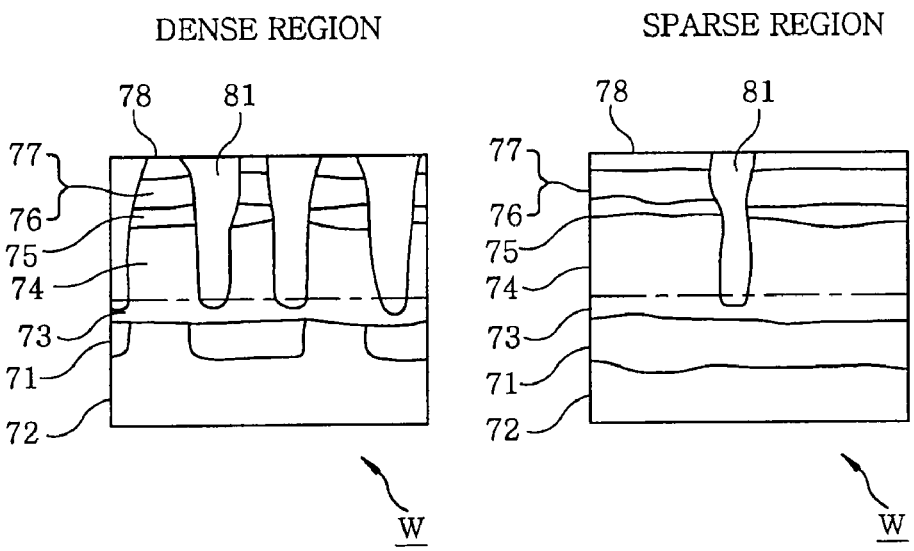

FIGS. 7A and 7B are schematic views prepared on the basis of SEM photographs of the dense region and the sparse region in test example 1-1. Measurement was performed at a central part (FIG. 7A) and at a peripheral part (FIG. 7B) of the wafer W. As a result, in both the dense region and the sparse region in the surface, the via-holes 81 reached the top surface of the SiCN film 73, and the etching depth of the SiCN film 73 was about 10 nm, which is small and in a good state. Test example 1-2 and comparative example 1 also showed the same results. Herein, since it is difficult to draw an exact interface between the SiCN film 73 and the SiCOH film 74 in the SEM photographs, the interface is designated by dotted lines.

Figure 8A:
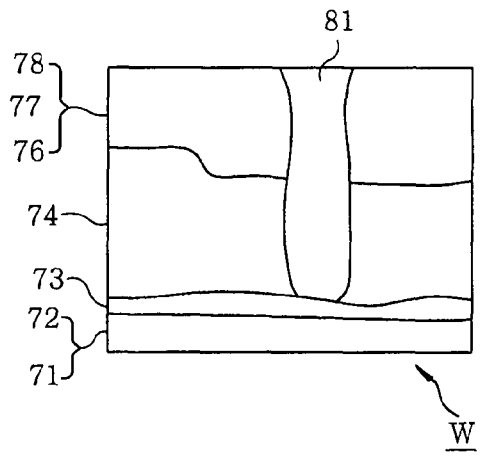
FIGS. 8A to 8C are schematic views of SEM photographs showing a cross section of a substrate obtained by a test example of the present invention.
Figure 8B:
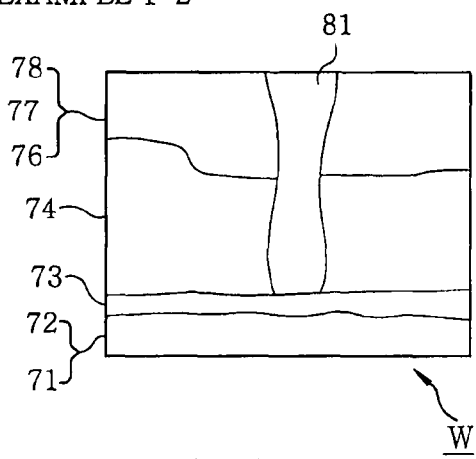
Figure 8C:
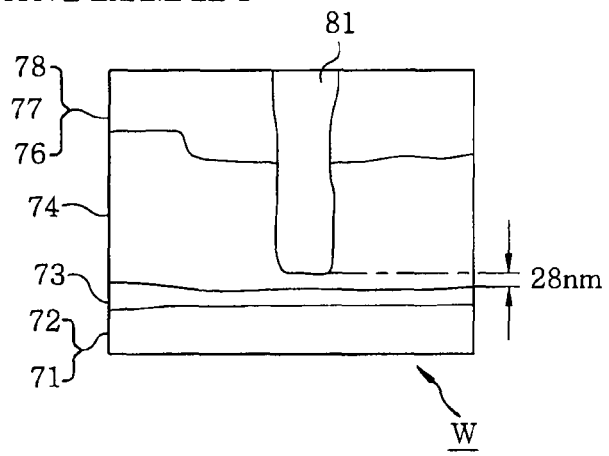
Figure 9A:
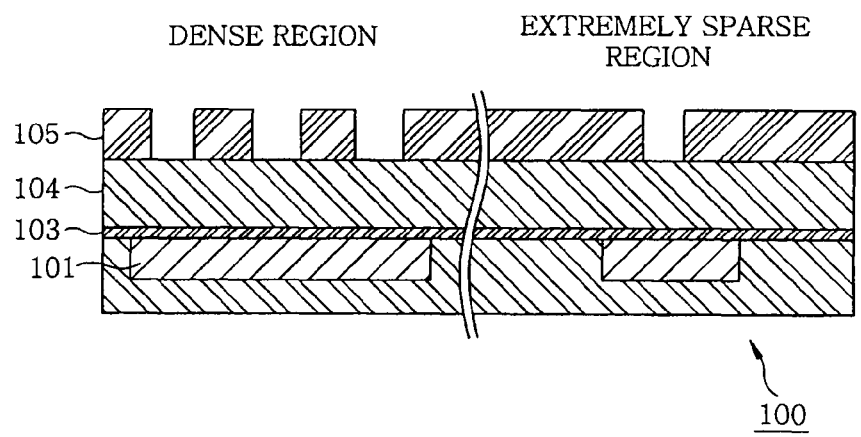
FIGS. 9A to 9C are cross-sectionals view for explaining a conventional etching process.
Figure 9B:
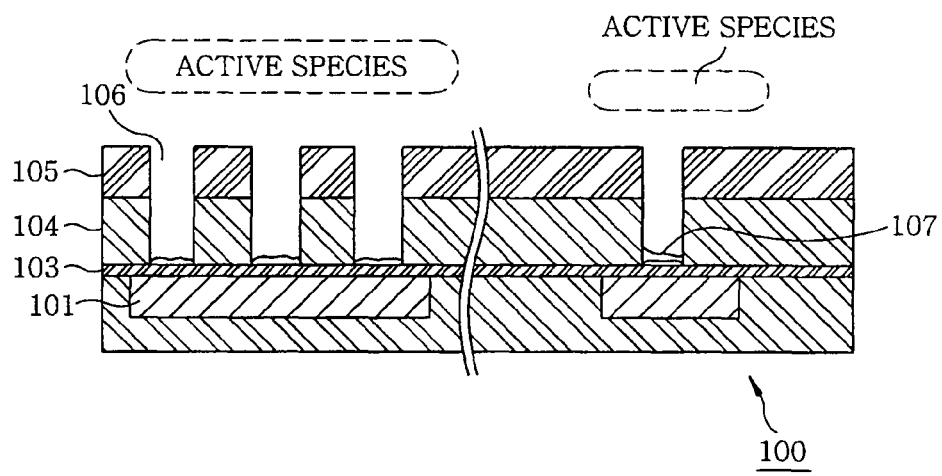
Figure 9C:
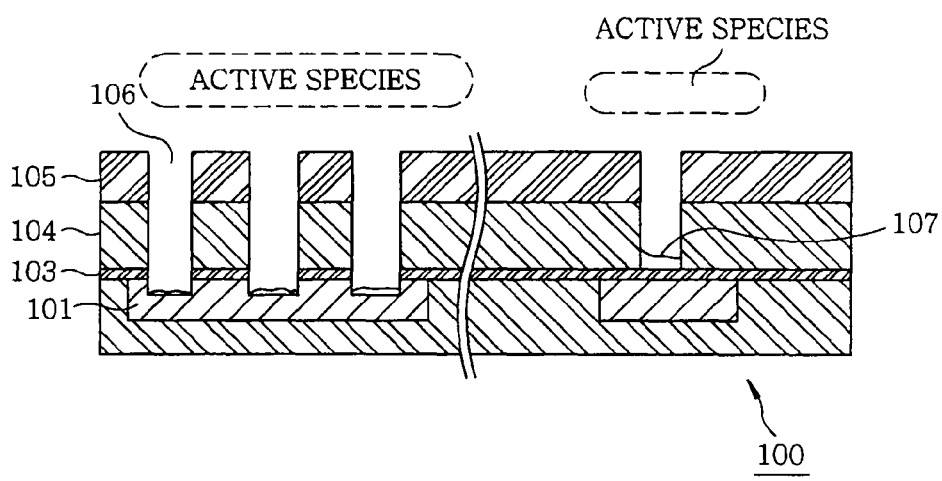

However, as shown in FIGS. 8A to 8C, in the extremely sparse region where the gap between the via-holes 81 is very large, the via-holes 81 reached the top surface of the SiCN film 73 in test example 1-1 (see FIG. 8A) and test example 1-2 (see FIG. 8B), but the etching was stopped in the middle of the SiCOH film 74 in comparative example 1 (see FIG. 8C). In comparative example, an unetched depth of 28 nm was verified between the bottom surface of the via-hole 81 and the top surface of the SiCN film 73.

It could be seen from the foregoing that, even in the region where the gap L between the via-holes was 10 µm or more, the via-holes 81 could reach the same depth as in other regions where the gap L was smaller by applying a negative DC voltage to the upper electrode 4. In addition, from the results of test example 1-1 and test example 1-2, it could be confirmed that the etching time could be shortened by, e.g., using process gas including carbon and fluorine other than $C_4F_8$ gas.

Further, upon completion of the main etching, a distance (a residual thickness of the SiCOH film 74) between the bottom surface of the via-hole 81 and the top surface of the SiCN film 73 was about 30 nm. Besides, the shield rings formed to respectively surround the devices were measured as well (although not shown), and good results as above were obtained.

Test Example 2

Next, in order to simply evaluate the depth of the via-holes 81 formed by the main etching and the over-etching, the etching was performed for the wafer W prepared without forming the SiCN film 73 or the SiCOH film 72 under the SiCOH film 74 under the conditions same as Text Example 1-1 except the following conditions; and then, the depth of the via-holes 81 was measured.

Processing Conditions

Step 2: Main Etching

Processing time: 11 seconds

Step 3: Over-etching

Processing time: 34 seconds

Test Results

The etch rates of the respective films were obtained from the depth of the via-holes 81 and the remaining film thickness of the resist mask 78 after the etching. The results were represented as the following Table 1.

TABLE 1

|  | Central part of wafer | | Peripheral part of wafer | |
|---|---|---|---|---|
|  | Dense region | Sparse region | Dense region | Sparse region |
| Depth of via-hole 81 | 325 | 273 | 343 | 325 |
| Etch rate Resist mask 78 | 75 | 49 | 49 | 53 |
| (nm/min) SiCOH film 74 | 181 | 154 | 176 | 229 |

As shown above, it could be understood that the etch rate of the SiCOH film 74 did not vary significantly depending on the distribution of the via-holes 81 and the location in the wafer W. That is, the via-holes 81 were formed with an approximately same depth. In addition, the μ-loading value (represented as the depth of the via-holes 81 in the sparse regions divided by the depth of the via-holes 81 in the dense regions) was 0.78, which was a favorable result.

Further, it was found that, by using the process gas of the above, the SiCOH film 74 could be etched to a state where the selection ratio with respect to the resist mask 78 is high (that is, the etch rate of the resist mask 78 is greatly different from that of the SiCOH film 74).

Text Example 3

In order to check whether the same effect as the present invention can be obtained in case of changing the processing conditions for the over-etching without applying a negative DC voltage to the upper electrode 4, a test was performed on the same wafer W as in text example 1 under the processing conditions described later. Herein, the test was performed under the conditions such that the via-hole 81 was formed to the top surface of the SiCN film 73 in the extremely sparse regions where the gap L between the adjacent via-holes 81 is 10 μm or more, and the via-hole 81 did not penetrate the SiCN film 73 in the dense regions and the sparse regions. Then, the dense regions and the sparse regions were observed. In the following conditions, those same as test example 1-1 are omitted.

Processing Conditions

Comparative Example 3-1

Step 2: Main Etching

Processing time: 11 seconds

Step 3: Over-etching

Process gas: $C_4F_8/Ar/N_2$=6/250/180 sccm
Negative DC voltage to the upper electrode 4: 0 V
Processing time: 32 seconds Comparative Example 3-2

Step 2: Main Etching

Processing time: 11 seconds

Step 3: Over-etching

Processing pressure: 6.7 Pa (50 mTorr)
Process gas: $C_4F_8/Ar/N_2/O_2$=6/250/180/10 sccm
Negative DC voltage of the upper electrode 4: 0 V
Processing time: 40 seconds Test Results Resultantly, the via-holes 81 in the dense regions and the sparse regions penetrated the SiCN film 73 in the central and the peripheral part of the wafer W in comparative example 3-1. In addition, the above-mentioned shield rings formed to surround the via-holes 81 showed the same result as follows.

In comparative example 3-2, the SiCN film 73 remained in the dense region and the sparse region, but was etched off in the regions of the shield rings. Further, it was confirmed that there were places without any resist mask 78 left therein on the wafer W.

From the above results, it was understood that it was very difficult to form the via-holes 81 to a uniform depth in the regions of the wafer W where the gap L between the adjacent via-holes 81 was large by changing only the processing conditions for the over-etching without applying a negative DC voltage to the upper electrode 4.

While the invention has been shown and described with respect to the embodiments, it will be understood by those skilled in the art that various changes and modifications may be made without departing from the scope of the invention as defined in the following claims.

What is claimed is:

1. A plasma etching method of plasma etching a substrate including an underlying film containing silicon and carbon, an insulating film to be etched containing silicon and carbon, and a resist mask having a pattern, wherein the underlying film, the insulating film and the resist mask are sequentially deposited from below, to thereby form a number of holes in the insulating film including a dense region where a density of the holes is high and a sparse region where the density of the holes is low, by using a parallel plate plasma etching apparatus for applying a plasma-generating high frequency electric power to a space between an upper electrode and a lower electrode to render a process gas into a plasma state and a biasing high frequency electric power to the lower electrode, the plasma etching method comprising:

mounting the substrate on a mounting table serving as the lower electrode in a processing chamber;

supplying a first process gas containing carbon and fluorine into the processing chamber to form the holes in the insulating film to a depth close to the underlying film by plasma etching the substrate; and supplying a second process gas including an inert gas and another gas contain carbon and fluorine into the processing chamber to have the holes reach the underlying film by plasma etching the substrate while applying a negative DC voltage to the upper electrode to thereby suppress variation in the distribution of active species over the entire surface of the substrate and suppress variation in the depth of the holes between the dense region and the sparse region, wherein, in the dense region, a distance between peripheries of adjacent ones of the holes is 0.1 μm or less, and wherein, in the sparse region, a distance between peripheries of adjacent one of the holes is 10 μm or more.

2. The plasma etching method of claim 1, wherein the holes are via-holes for burying an electrode part or a connection part that connects a lower wiring to an upper wiring.

3. The plasma etching method of claim 1, wherein the underlying film is made of silicon, carbon and nitrogen, and the insulating film is made of silicon, oxygen, carbon and hydrogen.

4. The plasma etching method of claim 1,
wherein the first process gas includes a $CF_4$ gas and an inert gas, and further includes at least one selected from a $C_4F_8$ gas, a $C_4F_6$ gas and a $C_5F_8$ gas, wherein the second process gas includes an Ar gas and a nitrogen gas or an $O_2$ gas, and further includes at least one selected from a $C_4F_8$ gas, a $C_4F_6$ gas, and a $C_5F_8$ gas, and wherein the insulating film is a porous film whose relative permittivity is 2.5 or less.

5. The plasma etching method of claim 4, wherein the first process gas further includes an $O_2$ gas.

6. The plasma etching method of claim 1,
wherein the first process gas includes a $CF_4$ gas, an inert gas and an $O_2$ gas, and further includes at least one selected from a $CH_2F_2$ gas and a $CHF_3$ gas, wherein the second process gas includes an Ar gas and a nitrogen gas or an $O_2$ gas, and further includes at least one selected from a $C_4F_8$ gas, a $C_4F_6$ gas, and a $C_5F_8$ gas, and wherein the insulating film is a high density film whose relative permittivity is within a range from 2.7 to 3.0.

7. The plasma etching method of claim 6, wherein the first process gas further includes at least one selected from a $C_4F_8$ gas, a $C_4F_6$ gas and Ca $_5F_8$ gas.

* * * * *